(12) United States Patent
Gruen

(10) Patent No.: US 7,718,000 B2
(45) Date of Patent: May 18, 2010

(54) METHOD AND ARTICLE OF MANUFACTURE CORRESPONDING TO A COMPOSITE COMPRISED OF ULTRA NONACRYSTALLINE DIAMOND, METAL, AND OTHER NANOCARBONS USEFUL FOR THERMOELECTRIC AND OTHER APPLICATIONS

(75) Inventor: Dieter M. Gruen, Downers Grove, IL (US)

(73) Assignee: Dimerond Technologies, LLC, Downers Grove, IL (US)

(*) Notice: Subject to any disclaimer, the term of this patent is extended or adjusted under 35 U.S.C. 154(b) by 535 days.

(21) Appl. No.: 11/674,810

(22) Filed: Feb. 14, 2007

(65) Prior Publication Data

US 2007/0137684 A1    Jun. 21, 2007

Related U.S. Application Data

(63) Continuation-in-part of application No. 11/380,283, filed on Apr. 26, 2006, now Pat. No. 7,572,332.

(60) Provisional application No. 60/725,541, filed on Oct. 11, 2005.

(51) Int. Cl.
  C30B 3/00 (2006.01)
  C30B 25/00 (2006.01)
  C30B 29/04 (2006.01)

(52) U.S. Cl. .............. 117/4; 117/87; 117/929; 117/951; 977/712; 977/725

(58) Field of Classification Search .......... 117/4, 117/87, 929, 951; 977/712, 725
  See application file for complete search history.

(56) References Cited

U.S. PATENT DOCUMENTS

| 4,663,305 A * | 5/1987 | Mauldin et al. ............. 502/304 |
| 5,209,916 A | 5/1993 | Gruen |
| 5,273,788 A | 12/1993 | Yu |
| 5,328,676 A | 7/1994 | Gruen |
| 5,698,328 A | 12/1997 | Bunshah et al. |
| 5,772,760 A | 6/1998 | Gruen et al. |
| 6,020,677 A | 2/2000 | Blanchet-Fincher et al. |
| 6,592,839 B2 | 7/2003 | Gruen et al. |
| 6,791,108 B1 | 9/2004 | Olivas |
| 7,127,286 B2 | 10/2006 | Mech et al. |
| 7,309,446 B1 | 12/2007 | Kley |
| 7,309,476 B2 | 12/2007 | Carlson et al. |
| 7,312,562 B2 | 12/2007 | Dahl et al. |
| 7,572,332 B2 * | 8/2009 | Gruen ..................... 117/87 |
| 2003/0152700 A1 | 8/2003 | Asmussen et al. |
| 2004/0016397 A1 | 1/2004 | Carlson et al. |

(Continued)

*Primary Examiner*—G. Nagesh Rao
(74) *Attorney, Agent, or Firm*—Fitch Even Tabin & Flannery

(57) ABSTRACT

One provides (101) disperse ultra-nanocrystalline diamond powder material that comprises a plurality of substantially ordered crystallites that are each sized no larger than about 10 nanometers. One then reacts (102) these crystallites with a metallic component. The resultant nanowire is then able to exhibit a desired increase with respect to its ability to conduct electricity while also substantially preserving the thermal conductivity behavior of the disperse ultra-nanocrystalline diamond powder material. The reaction process can comprise combining (201) the crystallites with one or more metal salts in an aqueous solution and then heating (203) that aqueous solution to remove the water. This heating can occur in a reducing atmosphere (comprising, for example, hydrogen and/or methane) to also reduce the salt to metal.

8 Claims, 1 Drawing Sheet

---

*101* — PROVIDE AN ULTRA-NANOCRYSTALLINE POWDER MATERIAL COMPRISING A PLURALITY OF SUBSTANTIALLY ORDERED CRYSTALLITES EACH SIZED NO LARGER THAN ABOUT 10 NANOMETERS

*102* — REACTING THE CRYSTALLITES WITH A METALLIC COMPONENT

*100*

U.S. PATENT DOCUMENTS

| | | |
|---|---|---|
| 2004/0198048 A1 | 10/2004 | Dahl et al. |
| 2004/0198049 A1 | 10/2004 | Dahl et al. |
| 2004/0221796 A1 | 11/2004 | Swain et al. |
| 2004/0227138 A1 | 11/2004 | Dahl et al. |
| 2004/0247515 A1 | 12/2004 | Gardner |
| 2004/0251478 A1 | 12/2004 | Dahl et al. |
| 2005/0008560 A1 | 1/2005 | Kataoka et al. |
| 2005/0019114 A1 | 1/2005 | Sung |
| 2005/0168122 A1 | 8/2005 | Dahl et al. |
| 2005/0200260 A1 | 9/2005 | Swain et al. |
| 2006/0121279 A1 | 6/2006 | Petrik |
| 2006/0222850 A1 | 10/2006 | Xiao et al. |
| 2007/0082200 A1 | 4/2007 | Gruen |
| 2007/0126312 A1 | 6/2007 | Sung |
| 2007/0137684 A1* | 6/2007 | Gruen ................. 136/201 |
| 2007/0187153 A1 | 8/2007 | Bertagnolli |
| 2008/0226840 A1 | 9/2008 | Asmussen et al. |
| 2009/0004092 A1 | 1/2009 | Dolmatov |
| 2009/0017258 A1 | 1/2009 | Carlisle et al. |
| 2009/0042029 A1 | 2/2009 | Havel et al. |
| 2009/0092824 A1* | 4/2009 | Gruen ................. 428/328 |

* cited by examiner

US 7,718,000 B2

METHOD AND ARTICLE OF MANUFACTURE CORRESPONDING TO A COMPOSITE COMPRISED OF ULTRA NONACRYSTALLINE DIAMOND, METAL, AND OTHER NANOCARBONS USEFUL FOR THERMOELECTRIC AND OTHER APPLICATIONS

RELATED APPLICATIONS

This application claims the benefit of the filing date of U.S. Provisional Patent Application No. 60/725,541, Filed Oct. 11, 2005, which is hereby incorporated in its entirety herein.

This application is a continuation-in-part of a patent application entitled an apparatus, method, and article of manufacture corresponding to a self-composite comprised of nanocrystalline diamond and a non-diamond component that is useful for thermoelectric applications as was filed on Apr. 26, 2006 as U.S. patent application Ser. No. 11/380,283, now U.S. Pat. No. 7,572,332 the contents of which are fully incorporated herein by this reference.

GOVERNMENT RIGHTS

This invention was made with Government support under Contract No. W-31-109-ENG-38 awarded by the United States Department of Energy. The Government has certain rights in this invention.

TECHNICAL FIELD

This invention relates generally to ultrananocrystalline diamond, metal, and other nanocarbon nanocomposite materials as well as to thermoelectric, nuclear, medical, and other materials and practices.

BACKGROUND

The direct conversion of thermal energy into electrical energy (without the use of rotating machinery) is known in the art. This technology typically finds little practical application, however, as presently achievable conversion efficiencies are quite poor. For example, while such mechanisms as steam turbines are capable of conversion efficiencies in excess of about 50%, typical prior art direct conversion thermoelectric energy (TE) techniques offer only about 5 to 10% conversion efficiencies with even the best of techniques yielding no more than about 14% in this regard.

TE technologies generally seek to exploit the thermal energy of electrons and holes in a given TE material to facilitate the conversion of energy from heat to electricity. An expression to characterize the maximum efficiency for a TE power generator involves several terms including the important dimensionless figure of merit ZT. ZT is equal to the square of the Seebeck coefficient as multiplied by the electrical conductivity of the TE material and the absolute temperature, as then divided by the thermal conductivity of the TE material. With a ZT value of about 4, a corresponding TE device might be expected to exhibit a conversion efficiency approaching that of an ideal heat-based engine. Typical excellent state of the art TE materials (such as Bi2Te3-Bi2Se3 or Si—Ge alloys), however, have ZT values only near unity, thereby accounting at least in part for the relatively poor performance of such materials.

To reach a value such as 4 or higher, it appears to be necessary to maximize the power factor while simultaneously minimizing the thermal conductivity of the TE material (where the power factor can be represented as the product of the square of the Seebeck coefficient and the electrical conductivity). This has proven, however, a seemingly intractable challenge. This power factor and thermal conductivity are transport quantities that are determined, along with other factors, by the crystal and electronic structure of the TE material at issue. These properties are also impacted by the scattering and coupling of charge carriers with phonons. To maximize TE performance, these quantities seemingly need to be controlled separately from one another and this, unfortunately, has proven an extremely difficult challenge when working with conventional bulk materials.

Bulk refractory nanocrystalline powder materials are also known in the art and include, for example, disperse diamond powder. As bulk diamond comprises both an outstanding thermal conductor and a superb electrical insulator, bulk diamond is quite unsuited for use as a TE material for at least the reasons set forth above. In more recent times, however, nanocrystalline diamond material (having crystallite sizes of about 2 to 5 nanometers) has been successfully doped to achieve n or p-type electrically conducting material at ambient temperatures of interest while also exhibiting very low thermal conductivity. To date, however, no one has suggested a way to make good upon such possibilities and hopes for a useful TE material continue to remain mere unmet aspirations.

BRIEF DESCRIPTION OF THE DRAWINGS

The above needs are at least partially met through provision of the method and article of manufacture corresponding to a composite comprised of disperse ultrananocrystalline diamond, metal, and other nanocarbons material described in the following detailed description, particularly when studied in conjunction with the drawings, wherein.

Figure 1:
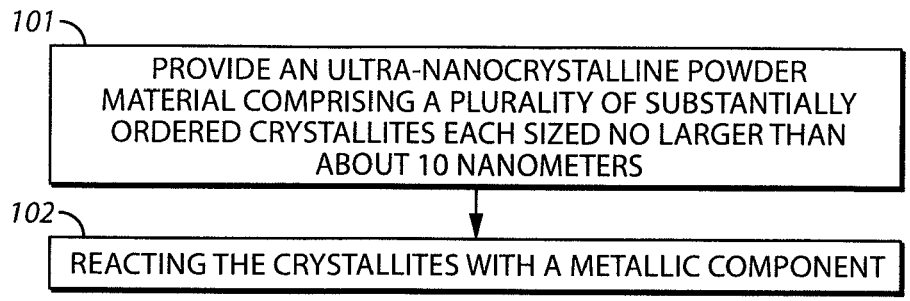
FIG. 1 comprises a flow diagram as configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, one provides disperse ultra-nanocrystalline powder material that comprises a plurality of substantially ordered crystallites that are each sized no larger than about 10 nanometers. One then reacts these crystallites with a metallic component. The resultant nanocarbon encapsulated nanowires or quantum dots are then able to exhibit a desired increase both with respect to an ability to conduct electricity and in the density of states leading to an increase in thermal power while also preserving close to the thermal conductivity behavior of the disperse ultra-nanocrystalline diamond material itself.

The disperse ultra-nanocrystalline diamond powder material may comprise, for example, bulk disperse diamond powder having a very low density as compared to diamond's density. The reaction process is preceded, for example, by combining the crystallites with one or more metal salts in an aqueous solution and then heating that aqueous solution to remove the water. This heating can occur in a reducing atmosphere (comprising, for example, hydrogen and/or methane) to reduce the metal ions in the solution to the metallic state. The reaction process carried out at a higher temperature involves the conversion of part of the diamond to form fullerenic, graphitic, or carbon nanotube encapsulates of nanoparticles of metal. In this way a nanoporous nanocomposite is formed that is stable to temperatures at least up to 1000 degrees C.

By one approach this reaction of the crystallites with a metallic component can comprise inhomogeneously combining the crystallites with the metal salt(s) in the aqueous solution. This, in turn, can yield a resultant thermoelectric component having an inhomogeneous concentration of metal between a so-called hot and cold terminus of the thermoelectric component. Combining different metal salts in the same solution results in alloy formation during the reduction step.

So configured, these teachings appear able to yield appreciable quantities of a material having properties well suited to TE power generation. It appears reasonable, for example, to expect such materials to exhibit a level of conversion efficiency that compares well against existing non-TE approaches. This, in turn, presents the possibility and hope of providing improved TE power generators not only in situations where TE generation is already used but as a substitute for existing rotating-machinery-based power generation. Those skilled in the art will also appreciate that these teachings can be readily applied to obtain a resultant product having essentially any shape or form factor as desired.

These teachings appear able to yield appreciable quantities of a material well suited as a fuel and cladding in a "pebble bed" type gas cooled nuclear reactor. Those skilled in the art will also recognize and understand that these teachings similarly appear well suited for medical applications and in particular for radiation-based cancer treatments.

These and other benefits may become clearer upon making a thorough review and study of the following detailed description. Referring now to the drawings, and in particular to FIG. 1, an illustrative corresponding process 100 begins with provision 101 of refractory nanocrystalline powder material comprising a plurality of substantially ordered crystallites each sized no larger than about 10 nanometers. This material might also comprise occasional larger-sized particles, of course, but should nevertheless be substantially if not exclusively comprised of particles of about 1 to 10 nanometers in size.

By one approach this refractory nanocrystalline powder material can comprise bulk disperse ultra-nanocrystalline diamond material. Ultradisperse diamond crystallites (as may be formed, for example, using detonation techniques in accordance with known prior art technique) are commercially available in bulk powder form having particles sized from about 2 to 10 nanometers. This powder will typically comprise a disperse diamond powder having a very low density as compared to diamond's density. This very low density might comprise, for example, only about one fourth or even only about one tenth of diamond's density.

This process 100 then provides for reacting 102 these crystallites with a metallic component. Various metals will serve in this regard, though cobalt may be particularly useful for TE application settings (where those skilled in the art will appreciate that other metals, including 3D, 4D, 5D, 4F, and/or 5F series of elements could be similarly employed if desired). These teachings will also accommodate, if desired, reacting 102 these crystallites with a plurality of different metallic components comprising a metallic alloy component. By one approach, this step can comprise reacting the crystallites with a metallic component to thereby form nanocarbon encapsulated electrically conductive nanowires (or quantum dots) that are comprised of that metal. This step can also comprise, if desired, forming nanotubes, at least in part, of these crystallites.

Those skilled in the art will recognize and appreciate that such an approach can serve to form a material having high electrical conductivity, high thermal power, and low thermal conductivity while being protected from agglomeration and other reactions. Such properties, of course, are of great interest particularly in thermoelectric settings. It will also be seen that these teachings are readily usable to form such material in any of a wide variety of particular predetermined shapes (including simple geometric shapes as well as more complicated and/or convoluted shapes of choice).

These teachings will accommodate reacting these crystallites with a metallic component using any of a variety of approaches as desired. For the purposes of illustration and example, and not by way of limitation, some particular approaches in this regard will now be presented. Such approaches could involve among others using an aqueous solution of the metallic salt, ultrasonication of disperse ultrananocrystalline diamond with a metal oxide powder, or thermal decomposition of an organometallic compound on a bed of disperse ultrananocrystalline diamond.

Figure 2:
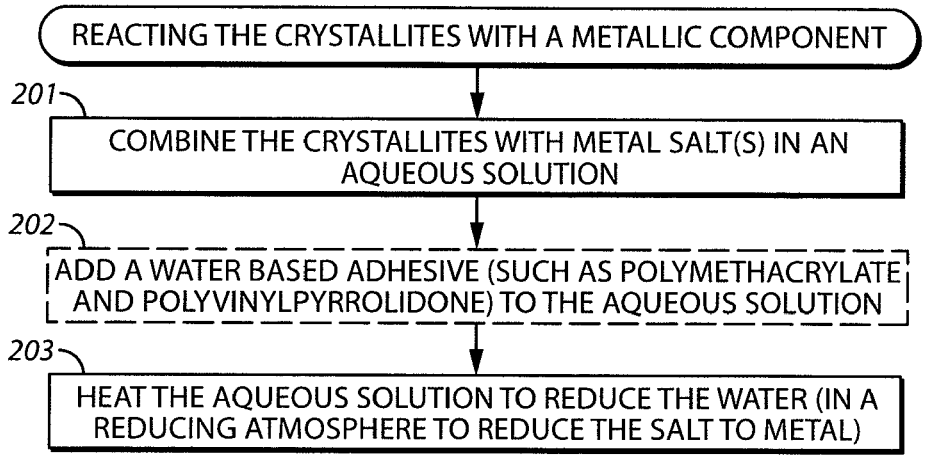
FIG. 2 comprises a flow diagram as configured in accordance with various embodiments of the invention.

Referring to FIG. 2, this can comprise, for example, combining 201 these crystallites with at least one metal salt in an aqueous solution. Generally speaking it may be useful for most application settings to use a salt that exhibits a relatively high solubility in water (or alcohol, if desired) to thereby achieve a relatively highly concentrated solution (of, say, between five and ten moles per liter of the salt). As one example in this regard, the metal salt might comprise cobalt nitrate (taken twice bivalent).

Exact proportions of these materials can vary with the application setting and the specific intended result. By one approach, however, this can comprise making a five molar solution of this cobalt nitrate in water and then combining this solution with a sufficient amount of the disperse ultra-nanocrystalline diamond material to permit, generally speaking, one cobalt atom to be absorbed on essentially every exposed carbon atom on the exposed surface of the diamond material. Generally speaking, the size of the metallic nanowires/quantum dots as are formed by these processes can be effectively controlled, at least in part, by controlling the concentration of this salt in the aqueous solution.

Those skilled in the art will recognize and understand that the disperse ultra-nanocrystalline diamond material offers, relatively speaking, a relatively high quantity of such exposed surface opportunities. Material such as that suggested above, for example, can offer between 500 and 1,000 square meters of such surface area for each gram of this powder. This, in turn, permits a relatively large quantity of metal salt to be absorbed as essentially each exposed carbon atom absorbs a corresponding cobalt atom. At this point in the process, the resultant combination will comprise a paste-like material having a density that has increased to about unity.

As noted earlier, this step can comprise combining the crystallites with a plurality of different metal salts in the aqueous solution. Examples might include, but are not limited to, iron, nickel, copper, manganese, uranium, plutonium, europium, gadolinium, and so forth. As will become clearer below, combinations of such metals will form a corresponding alloy, thereby rendering these teachings a simple and elegant technique for making alloys of virtually any desired composition.

Optionally, if desired, these teachings will also accommodate further adding a water based adhesive to the aqueous solution. As will be understood by those skilled in the art, such a component will serve to enhance the mechanical integrity of the aforementioned coating. The particular adhesive employed in a given setting can of course vary, but polymethacrylate and polyvinylpyrrolidone (in combination with one another) will serve well in a variety of application settings.

In any event, these teachings then provide for heating 203 the aqueous solution to thereby remove at least some of the water. This can comprise, by one approach, heating the aqueous solution to at least 600 degrees Centigrade (or even 700 or 800 degrees Centigrade) until a sufficient quantity of water has been so removed. By one approach this can comprise removing essentially all of the water and carrying out the reaction described below.

This step can also comprise heating the solution in a reducing atmosphere to thereby also reduce the metal ions to metal. This can comprise, but is not limited to, use of a reducing atmosphere comprised substantially (or exclusively) of hydrogen and methane. By this approach, the nitrate is at least substantially decomposed, and the oxide reduced to cobalt metal. Those skilled in the art might recognize such a process as resembling, at a nano-scale, a kind of smelting process.

Those skilled in the art will also recognize and understand that such a process will cause the metal component to become encapsulated with layers of nanocarbons composed of fullerenes, graphite, or multi-walled carbon nanotubes. More particularly, the cobalt in this example will form carbon encapsulated nanowires and/or quantum dots of cobalt, thereby yielding a highly conducting nanomaterial composed of disperse ultra-nanocrystalline diamond, cobalt, and nanocarbons.

This cobalt can also serve as a catalyst for growing nanotubes during this process. Furthermore, excess methane and hydrogen in the reducing atmosphere are also conducive to the growth of nanotubes. Consequently, nanotubes are growing as the cobalt nanowires are forming to thereby yield a resultant material comprising diamond, cobalt, and nanotubes tightly intergrown with one another. The resultant material therefore exhibits high mechanical rigidity, is relatively highly densified (though still likely less than half the density of diamond itself, and perhaps as low as one third diamond's density), is electrically conducting, and is also thermally insulating.

Because the diamond component begins as a powder, it is possible to essentially form and shape these materials as desired to yield a resultant rigid material having essentially any desired form factor.

These teachings will also accommodate inhomogeneously combining the crystallites with one or more metal salts in the aqueous solution to thereby yield a resultant material having an inhomogeneous metal concentration. This, in turn, can serve to yield a material having an inhomogeneous metal concentration between a hot and cold terminus of a corresponding thermoelectric component.

Figure 3:
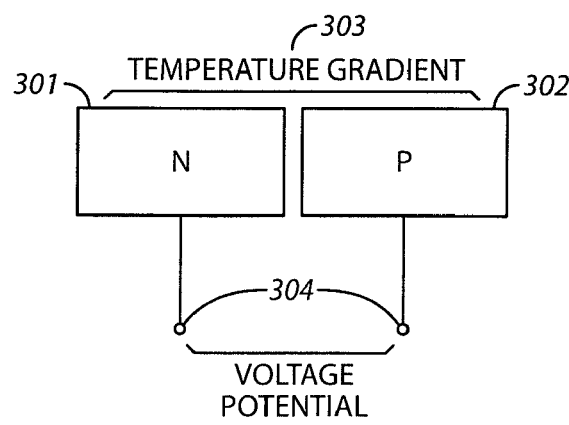
FIG. 3 comprises a block diagram as configured in accordance with various embodiments of the invention.

So configured, and referring now to FIG. 3, such material can be readily applied as a key TE component. To illustrate, an n-type block 301 of material and a p-type block 302 of material as described above, when subjected to a temperature gradient 303, will provide a voltage potential 304 (as electrons will seek to flow from the warmer area to the cooler area) at corresponding electrodes as shown to thereby provide an effective and efficient TE power generator 300.

Other applications for these teachings exist as well. As one example, these teachings can be employed to produce a material that can materially facilitate a controlled nuclear reaction. Gas cooled nuclear reactor designs are ordinarily based primarily on fissile fuel pellets coated with pyrolitic graphite. One of the factors limiting the performance of such reactors is heat transfer from the fissile uranium (plutonium) core to the helium gas coolant. This limitation can be overcome by applying these teachings to yield nanometer sized pellets that are clad in a nanocarbon material (or materials) (simply using nanosized materials, alone, will not adequately address this problem as the temperatures are so high that nanosized materials would ordinarily not be expected to remain nanosized). The elimination of heat transfer limitations in this application setting would reduce helium pumping requirements substantially and improve the energy efficiency of "pebble bed" reactors.

As another example, these teachings can be employed to yield a composite that can be used as a delivery mechanism for a medical procedure. To illustrate, the efficacy of cancer treatment strongly depends on the degree to which the curative agent reaches cancerous and only cancerous cells. Ultrananocrystalline diamond/metal/nanocarbon composites formed via these teachings are small enough to diffuse through cell membranes. Such composites can include and be coated with a substance that seeks out cancer cells. Using a radioactive metal component, requisite radiation doses can be delivered directly to the interior of the cancer cell to destroy it in a highly targeted fashion.

Other applications of the unique nanocarbon encapsulated metal or metal carbide nanowires or quantum data are too numerous to be separately mentioned here but will be readily apparent to those skilled in the relevant arts.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. As but one example in this regard, various other metals other than cobalt (such as, for example, other transition metals such as metals in the iron group, the rare earth group, gadolinium, and europium) are suitable candidates and particularly when considering TE applications.

I claim:

1. A method of forming a thermoelectric material comprising:
   providing a nanocrystalline powder material comprising a plurality of carbon-containing sp3-bonded solid refractory material crystallites each sized no larger than about 10 nanometers;
   reacting the crystallites with a metallic or metal carbide component, wherein reacting the crystallites with a metallic or metal carbide component comprises combining the crystallites with a metal salt in an aqueous solution and controlling resulting metallic nanowires size by controlling concentration of the salt.

2. A method of forming a thermoelectric material comprising:
  providing a nanocrystalline powder material comprising a plurality of carbon-containing sp3-bonded solid refractory material crystallites each sized no larger than about 10 nanometers;
  reacting the crystallites with a metallic or metal carbide component, wherein reacting the crystallites with a metallic or metal carbide component comprises:
  combining the crystallites with a metal salt in an aqueous solution;
  enhancing mechanical integrity of a coating on the crystallites by adding a water based adhesive comprising, at least in part, polymethacrylate and polyvinylpyrrolidone to the aqueous solution.

3. A method of forming a thermoelectric material comprising:
  providing a nanocrystalline powder material comprising a plurality of carbon-containing sp3-bonded solid refractory material crystallites each sized no larger than about 10 nanometers;
  reacting the crystallites with a metallic or metal carbide component, wherein reacting the crystallites with a metallic or metal carbide component comprises inhomogeneously combining the crystallites with a metal salt in an aqueous solution.

4. The method of claim 3 wherein inhomogeneously combining the crystallites with a metal salt in an aqueous solution comprises inhomogeneously combining the crystallites with a metal salt in an aqueous solution to yield a resultant thermoelectric component having an inhomogeneous concentration of metal between a hot and cold terminus of the thermoelectric component.

5. A method of forming a thermoelectric material comprising:
  providing a nanocrystalline powder material comprising a plurality of carbon-containing sp3-bonded solid refractory material crystallites each sized no larger than about 10 nanometers;
  reacting the crystallites with a metallic or metal carbide component, wherein reacting the crystallites with a metallic or metal carbide component comprises, at least in part:
  combining the crystallites with a metal salt in an aqueous solution;
  heating the aqueous solution in a reducing atmosphere to remove water and to reduce the salt to metal.

6. The method of claim 5 wherein heating the aqueous solution in a reducing atmosphere to reduce the salt comprises heating the aqueous solution in a reducing atmosphere comprising hydrogen and methane.

7. The method of claim 5 wherein heating the aqueous solution comprises heating the aqueous solution to at least 600 degrees Centigrade to initiate the reaction between the crystallites and the metallic or metal carbide component.

8. A method of forming a thermoelectric material comprising:
  providing a nanocrystalline powder material comprising a plurality of carbon-containing sp3-bonded solid refractory material crystallites each sized no larger than about 10 nanometers;
  reacting the crystallites with a metallic or metal carbide component, wherein reacting the crystallites with a metallic or metal carbide component comprises reacting the crystallites, at least in part, with cobalt to form encapsulated cobalt nanowires.

* * * * *

UNITED STATES PATENT AND TRADEMARK OFFICE
CERTIFICATE OF CORRECTION

| | |
|---|---|
| PATENT NO. | : 7,718,000 B2 |
| APPLICATION NO. | : 11/674810 |
| DATED | : May 18, 2010 |
| INVENTOR(S) | : Dieter M. Gruen |

It is certified that error appears in the above-identified patent and that said Letters Patent is hereby corrected as shown below:

ON FACE PAGE:

In the Title: Section (54), Line 4: Change "Nonacrystalline" to -- Nanocrystalline --.

IN THE SPECIFICATION:

Column 1, Line 4: Change "Nonacrystalline" to -- Nanocrystalline --.

Signed and Sealed this

Thirty-first Day of August, 2010

David J. Kappos
*Director of the United States Patent and Trademark Office*